(12) United States Patent
Cusmai et al.

(10) Patent No.: US 7,649,424 B2
(45) Date of Patent: Jan. 19, 2010

(54) METHOD OF ADJUSTING THE RESONANCE FREQUENCY OF AN L-C RESONANT CIRCUIT AND RESONANT CIRCUIT

(75) Inventors: Giuseppe Cusmai, Pavia (IT); Matteo Repossi, Pavia (IT); Guido Albasini, Voghera (IT); Francesco Svelto, Pavia (IT)

(73) Assignee: STMicroelectronics S.r.l., Agrate Brianza (MI) (IT)

( * ) Notice: Subject to any disclaimer, the term of this patent is extended or adjusted under 35 U.S.C. 154(b) by 52 days.

(21) Appl. No.: 12/015,281

(22) Filed: Jan. 16, 2008

(65) Prior Publication Data
US 2008/0174378 A1    Jul. 24, 2008

(30) Foreign Application Priority Data
Jan. 17, 2007    (IT)    ................ VA2007A0009

(51) Int. Cl.
*H03B 5/12* (2006.01)
*H03B 27/00* (2006.01)
*H03L 7/24* (2006.01)

(52) U.S. Cl. ............... 331/117 R; 331/45; 331/55; 331/117 FE; 331/177 R; 331/177 V; 331/173; 331/181

(58) Field of Classification Search ............ 331/45, 331/117 R, 117 FE, 117 D, 167, 177 R, 177 V, 331/181, 46, 55, 173
See application file for complete search history.

(56) References Cited

U.S. PATENT DOCUMENTS 7,098,737 B2 *    8/2006    Fujimoto et al. ............ 330/283

* cited by examiner

*Primary Examiner*—David Mis
(74) *Attorney, Agent, or Firm*—Lisa K. Jorgenson; Allen, Dyer, Doppelt, Milbrath & Gilchrist, P.A.

(57) ABSTRACT

An L-C resonant circuit with an adjustable resonance frequency, having a capacitor and a first inductor electrically coupled together and a second inductor magnetically coupled to the first inductor. Additionally, there is a control circuit to sense a signal representing a first current flowing through the first inductor and to force through the second inductor a second current that is a replica of the first current for setting the adjustable resonance frequency of the L-C resonant circuit.

19 Claims, 3 Drawing Sheets

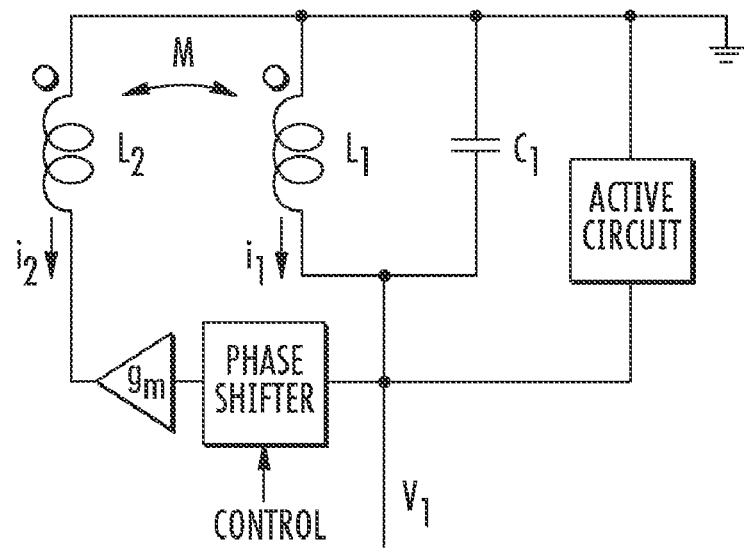
FIG. 3
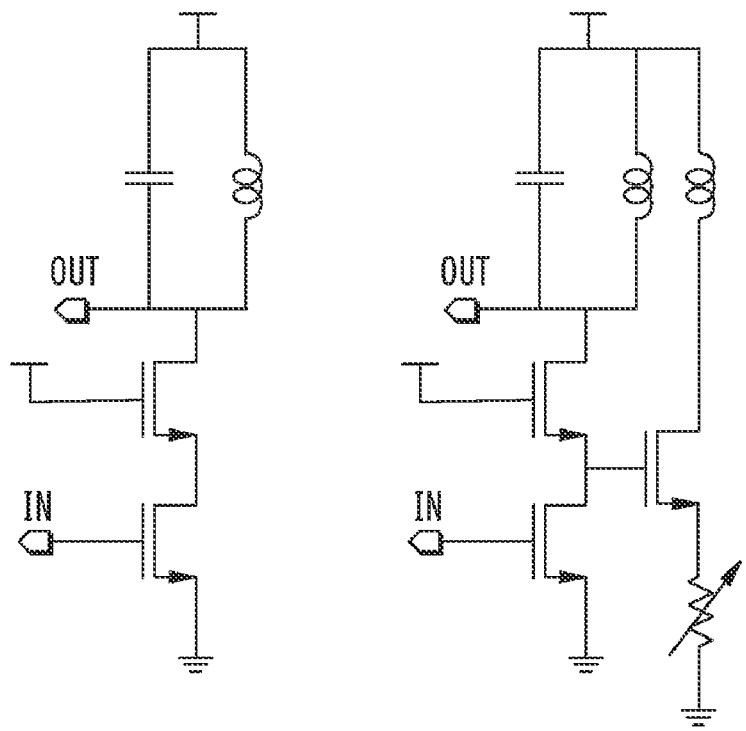
FIG. 4
PRIOR ART
FIG. 4B

METHOD OF ADJUSTING THE RESONANCE FREQUENCY OF AN L-C RESONANT CIRCUIT AND RESONANT CIRCUIT

FIELD OF THE INVENTION

This invention relates in general to L-C resonant circuits, and, more particularly, to an L-C resonant circuit with an adjustable resonance frequency and a method of adjusting the resonance frequency of an L-C resonant circuit.

BACKGROUND OF THE INVENTION

The demand for transmitters and receivers of greater and greater data rates is forcing manufacturers to realize devices capable of working at higher frequencies with a broad range of adjustment of the frequency. Typically, these devices include an L-C resonant circuit, such as that depicted in FIG. 1, that amplifies an input signal at a certain frequency.

In order to fully exploit the advantages of working at a high frequency, it should be possible to tune these devices, i.e. to adjust the resonance frequency of the L-C resonant circuit. This may be done by including in the resonant circuit a plurality of inductors singularly connectable to the capacitor through selection switches, or by varying the capacitance through varactors.

The main limitation of monolithic implemented resonator-based circuits (e.g. L-C oscillators, filters) is a generally limited tuning range.

The resonant frequency variation attainable by integrated variable capacitors (i.e. MOS or PN junction varactors) is usually limited to about 20-30% for applications in the 1-10 GHz range. This restriction results from design trade-offs between tuning range, noise, phase accuracy (if quadrature is required) and power consumption. Process scaling toward the nanometer scale and the low supply voltage sources of portable applications like wireless devices, makes the problems in using integrated L-C circuits tuned in such a way more severe.

A different tuning approach can be followed based on a configuration with switched inductors. However, this approach is rarely followed because of the finite resistance of the selection switch when conducting worsens the quality factor figure of the resonant circuit.

SUMMARY OF THE INVENTION

An L-C resonant circuit the resonance frequency of which may be adjusted without encountering the above noted limitations and drawbacks has now been found.

Differently from known approaches, the L-C resonant circuit of this invention may not use varactors or inductors connectable in the L-C tank circuit through selection switches for varying the resonance frequency.

According to this invention, the resonance frequency is adjusted through a second inductor magnetically coupled with the first inductor that is electrically coupled in parallel (or in series) to the capacitor of the L-C tank circuit in order to achieve the parallel (or series) resonance.

According to this method, the resonance frequency is adjusted by sensing the current flowing through the first inductor and by forcing through the second inductor a bias current that is a scaled and/or out of phase replica of the sensed current.

Preferably, the L-C tank circuit comprises a capacitor connected electrically in parallel to the secondary winding of a transformer providing the inductor of the L-C tank circuit, the primary winding of which is the second inductor that is magnetically coupled to the inductor of the L-C tank circuit.

More precisely, this invention may provide a method of adjusting the resonance frequency of an L-C resonant circuit and an L-C resonant circuit with adjustable resonance frequency, comprising a capacitor and a first inductor connected electrically in parallel or in series, a second inductor magnetically coupled with the first inductor, and a control circuit sensing a signal representing a first AC current flowing through the first inductor and forcing through the second inductor a second AC current that is a scaled and/or outphased replica of the first AC current for setting the resonance frequency of the L-C circuit at a desired value.

BRIEF DESCRIPTION OF THE DRAWINGS

The invention will be described referring to the attached drawings, wherein:

FIG. 3 depicts an embodiment of the L-C resonant circuit according to the invention;

FIGS. 4A and 4B compare a classic L-C resonant circuit with a sample L-C resonant circuit according to invention;

DETAILED DESCRIPTION OF THE PREFERRED EMBODIMENTS

Figure 1:
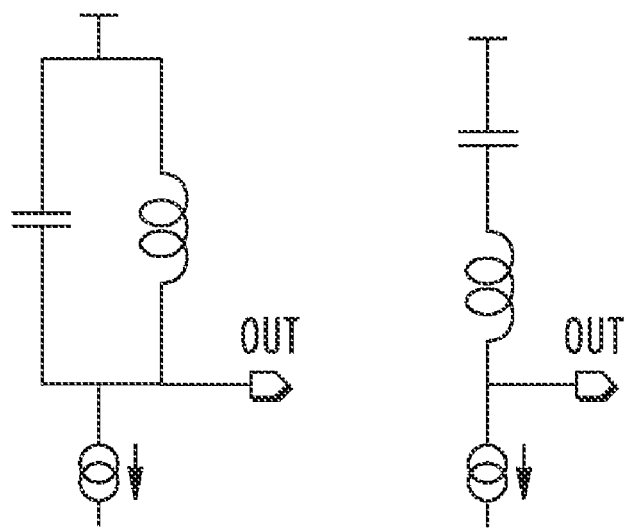
FIG. 1 depicts a basic L-C parallel and series resonant circuit in accordance with the prior art.
Figure 2:
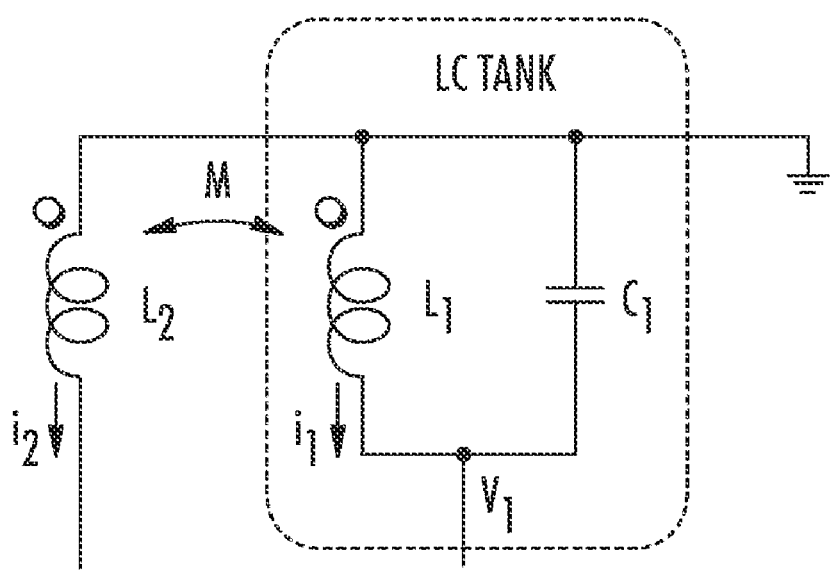
FIG. 2 depicts the L-C tank circuit of an L-C resonant circuit in accordance with the invention.

FIG. 2 shows the principle of the transformer-based L-C tank (or LMC tank). The innovative technique presented herein is based on the mutual magnetic coupling between the inductor L1 in the L-C tank and a second inductor L2. Preferably, the two inductors are the coils of a monolithically integrated transformer.

The resonance frequency of the L-C tank may be adjusted by controlling the AC current i2 flowing in the second inductor L2. By regulating the phase and/or the amplitude of the AC bias current forced through a primary winding it is possible to vary the resonance frequency of the L-C tank circuit.

Differently from known resonating circuits wherein transformers are commonly used only to achieve better phase noise figures, according to the method, a scaled and/or outphased replica current of the current flowing through the secondary winding L1 is forced through the primary winding L2 in order to vary the resonance frequency.

A mutual magnetic coupling M exists between the two windings. Usually, the strength of the coupling is represented by the pure number k, the value of which ranges between 0 and 1:

$$k = \frac{M}{\sqrt{L_1 L_2}} \quad (1)$$

From basic circuit inspection the following equation can be written in the time domain:

$$L_1 \frac{\partial i_1(t)}{\partial t} + M \frac{\partial i_2(t)}{\partial t} = -\frac{1}{C_1} \int i_1(t) dt \qquad (2)$$

Considering $i_1(t)$ and $i_2(t)$ as linearly dependent variables, in such a way that equation (3) is satisfied $$i_2(t) = \alpha \cdot i_1(t) \qquad (3)$$

equation (2) can be rewritten in terms of the voltage $V_1(t)$.

$$\frac{\partial^2 V_1(t)}{\partial t^2} + \frac{V_1(t)}{(L_1 + \alpha M)C_1} = 0 \qquad (4)$$

The differential equation (4) can be solved with respect to the voltage $V_1(t)$ $$V_1(t) = A \cos(2\pi f_0 t + \Phi) \qquad (5)$$

where the constants A and $\Phi$ depends on the Cauchy conditions and $f_0$, the resonance frequency, is given by:

$$f_0 \cong \frac{1}{2\pi \sqrt{(L_1 \pm \text{Re}[\alpha] \cdot M) \cdot C_1}} \qquad (6)$$

The resonance frequency depends on $\alpha$, i.e. the ratio between the currents flowing in the secondary and primary coils respectively. The parameter $\alpha$ is a real number that can have positive (in-phase $i_1(t)$ and $i_2(t)$), or negative (out-of-phase $i_1(t)$ and $i_2(t)$) real part. These options make it possible to obtain resonance frequencies lower or higher than the stand-alone $L_1 C_1$ tank resonance frequency.

A similar analysis, leading to the same results, can be made in the frequency domain. This technique can lead, in principle, to a very large tuning range. Simulations (Spectre-Momentum) performed for a CMOS 65 nm prototype show a tuning range in excess of 100%, from 3 GHz to 8 GHz.

An effective tuning method based on the above approach may be implemented in a resonating circuit, for example in the L-C oscillator of FIG. 3. The objective is to generate the current $i_2(t)$ and to vary its amplitude and/or outphasing with respect to $i_1(t)$ in order to tune the resonance frequency of the L-C circuit.

The AC voltage $V_1(t)$ is sensed to generate the current $i_2(t)$ through a transconductance amplifier $g_m$. The gain of this amplifier determines the magnitude of $i_2(t)$, and thus the resonance frequency of the L-C tank. Supposing that $V_1(t)$ and $i_1(t)$ are shifted by 90° (because, in the domain of the Laplace transform, $V_1(s) = j2\pi f_0 L_1 i_1(s)$), a phase shifter is inserted in the feedback loop to fix a pre-established phase relation between $i_1(t)$ and $i_2(t)$.

The active circuit may be as shown a relatively common functional block that is normally used to restore losses and to maintain a stable oscillation (i.e. negative resistance positive feedback latch). Its architecture is well known in the art and therefore it will not be described in detail.

In this way the resonance frequency is given by the following expression:

$$f_0 = \frac{1}{2\pi \sqrt{C_1 \left(L_1 \pm \left|\frac{i_2}{i_1}\right| M\right)}}$$

Of course, this is only an example of implementation. The resonance frequency can be tuned not only by varying the amplitude of $i_2$, as in the circuit of FIG. 3, but even by adjusting the phase of the current $i_2$. In fact, as shown in equation (3), the factor $\alpha$ may have a phase (relative to the phase relationship between $i_1$ and $i_2$). Moreover, in equation (6) the factor that modifies the resonance frequency is the in-phase or the out-of-phase component of the current ratio. Many circuits, such as resonating filters or RF amplifiers, may be realized by implementing this method in order to adjust the resonance frequency.

FIGS. 4A and 4B compare a classic L-C amplifier (left side) and an L-C tunable frequency amplifier (right side) of this invention. The functioning of these circuits is immediately evident for any skilled person and will not be illustrated further.

Figure 5:
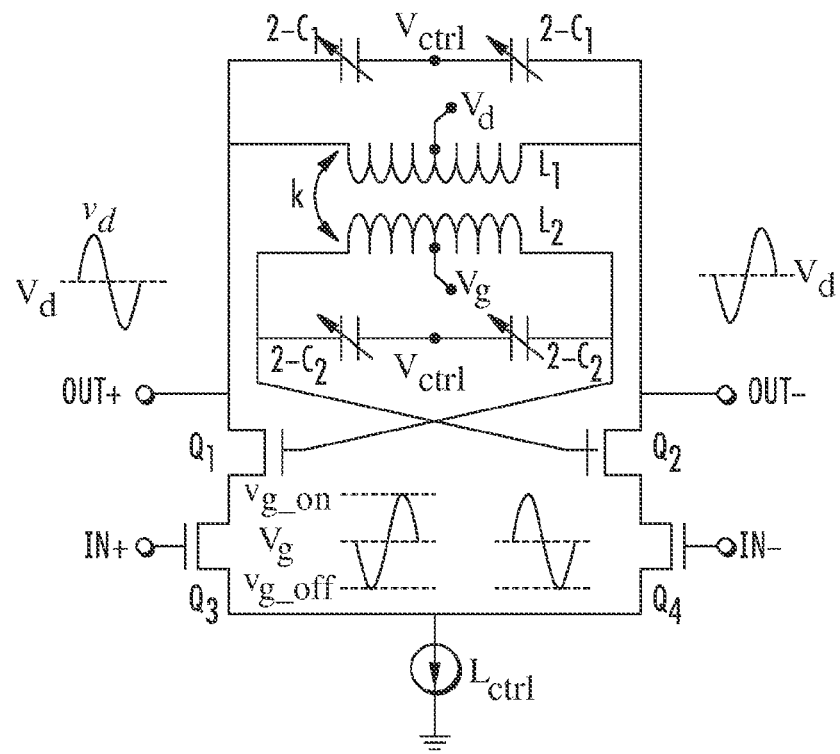
FIG. 5 depicts a CMOS VCO according to the prior art.

Another sample application is a quadrature oscillator. Quadrature VCOs, such as the one depicted in FIG. 5, disclosed in the article by D. Baek, T. Song, E. Yoon and S. Hong, "8-GHx CMOS Quadrature VCO Using Transformer-Based LC Tank", IEEE Microwave and wireless components letters, Vol. 13, No. 10, October 2003, are commonly used in transceivers when a direct conversion architecture is implemented. Using two transformers and two circuits identical to that shown in FIG. 3, a quadrature oscillator with two differential outputs, out pf phase 90 degrees with respect to each other, is obtained.

In this embodiment, the transformers are used to couple a number (two or more) of oscillators to obtain a ring oscillator behavior, where many (four or more) output phases are available.

Figure 6:
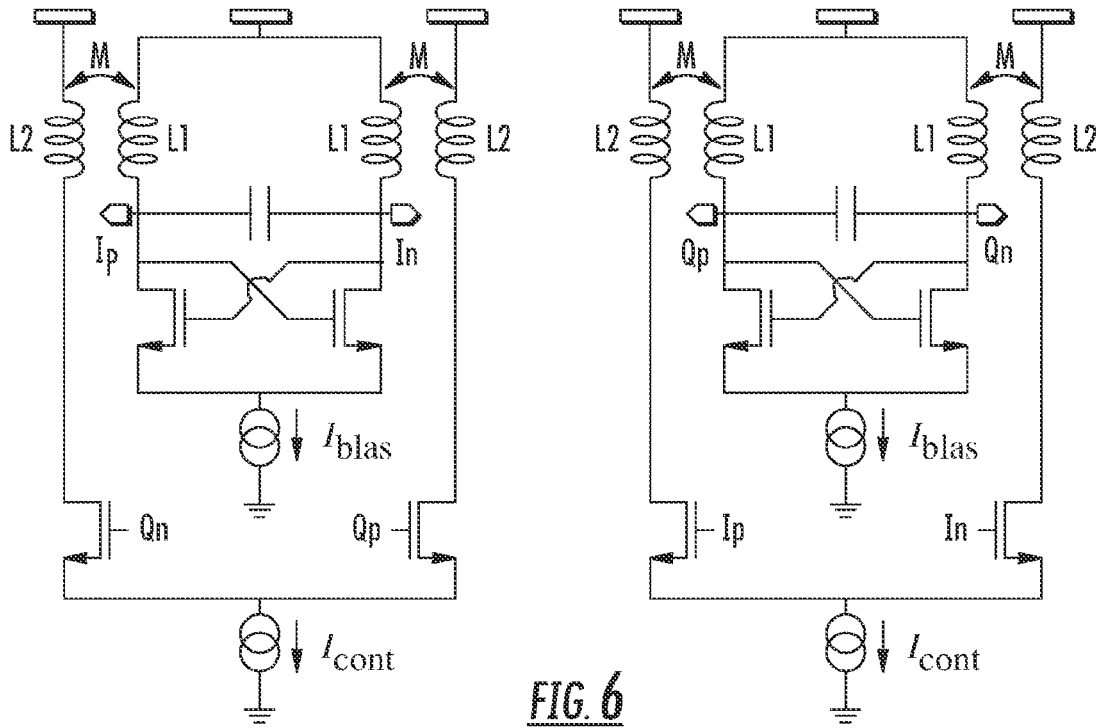
FIG. 6 depicts a quadrature VCO that generates two differential outputs in quadrature to each other according to the invention.

Differently from known architecture, such as those disclosed in the articles by A. Mazzanti, F. Svelto "A 1.8-GHz Injection-Locked Quadrature CMOS VCO With Low Phase Noise and High Phase Accuracy", IEEE Transactions on circuits and systems—I: Regular papers, Vol. 53, No. 3, March 2006, and A. Rofougaran, J. Rael, M. Rofougaran, A. Abidi "A 900 MHz CMOS LC-Oscillator with Quadrature Outputs, 1996 IEEE International Solid-State Circuits Conference, Feb. 10, 1996, pages 392-393, Paper SP 24.6, wherein such a ring structure is realized with active devices (MOS or bipolar junction transistors), in the circuit of this invention depicted in FIG. 6, two quadrature VCOs are coupled with each other while establishing a galvanic isolation of the oscillating L-C tank circuits. Moreover, the circuit depicted in FIG. 6 shows better noise figures than the VCOs disclosed in the above mentioned articles and its functioning is not negatively influenced when the outputs of the two oscillators are not very accurately in quadrature to each other.

That which is claimed:

1. An L-C resonant circuit with an adjustable resonance frequency comprising:
   a capacitor and a first inductor electrically coupled together;
   a second inductor magnetically coupled to said first inductor; and
   a control circuit to sense a signal representing a first current flowing through said first inductor and to force through said second inductor a second current that is a replica of the first current for setting the adjustable resonance frequency of the L-C resonant circuit.

2. The L-C resonant circuit of claim 1 wherein the second current is at least one of a scaled replica of the first current and an out of phase replica of the first current.

3. The L-C resonant circuit of claim 1 wherein said capacitor and said first inductor are electrically coupled in parallel.

4. The L-C resonant circuit of claim 1 wherein said capacitor and said first inductor are electrically coupled in series.

5. The L-C resonant circuit of claim 1, wherein said control circuit comprises:
   a phase shifter to be input with a voltage drop across said first inductor to generate an out of phase replica of the voltage drop; and
   a transconductance amplifier to be input with the out of phase replica of the voltage drop to thereby generate the replica of the first current.

6. An amplifier comprising:
   an input stage; and
   an L-C resonant circuit biased by said input stage and comprising a capacitor and a first inductor electrically coupled together,
   a second inductor magnetically coupled to said first inductor, and
   a control circuit to sense a signal representing a first current flowing through said first inductor and to force through said second inductor a second current that is a replica of the first current for setting a resonance frequency of the L-C resonant circuit.

7. The amplifier of claim 6, wherein said control circuit comprises:
   a phase shifter to be input with a voltage drop across said first inductor to generate an out of phase replica of the voltage drop; and
   a transconductance amplifier to be input with the out of phase replica of the voltage drop to thereby generate the replica of the first current.

8. The amplifier of claim 6, wherein the second current is at least one of a scaled replica of the first current and an out of phase replica of the first current.

9. The amplifier of claim 6, wherein said input stage is input with a single-ended input signal to be amplified to define a single-ended amplifier.

10. The amplifier of claim 6, wherein said input stage is input with a differential input signal to be amplified to define a differential amplifier.

11. The amplifier of claim 10, wherein the input stage is controlled by a differential output signal to define an oscillator to resonate at a resonance frequency.

12. The amplifier of claim 10, wherein said control circuit comprises:
   a phase shifter to be input with a voltage drop across said first inductor to generate an out of phase replica of the voltage drop; and
   a transconductance amplifier to be input with the out of phase replica of the voltage drop, to thereby generate the replica of the first current.

13. An oscillator to resonate at an adjustable resonance frequency and to generate two output differential voltages in quadrature to each other, the oscillator comprising:
   a first and a second differential amplifier to generate a differential output signal, each differential amplifier comprising an input stage controlled by a differential input signal to be amplified;
   an L-C resonant circuit with an adjustable resonance frequency biased by said input stage, said L-C resonant circuit comprising a capacitor and a first inductor electrically coupled together a second inductor magnetically coupled to said first inductor;
   a control circuit to sense a signal representing a first current flowing through said first inductor and to force through said second inductor a second current that is a replica of the first current for setting the adjustable resonance frequency of the L-C resonant circuit;
   said input stage of the first differential amplifier being controlled by a differential output signal of the second differential amplifier; and
   said input stage of the second differential amplifier being controlled by a differential output signal of the first differential amplifier.

14. The oscillator of claim 13, wherein the second current is at least one of a scaled replica of the first current and an out of phase replica of the first current.

15. The oscillator of claim 13, wherein said control circuit of the first differential amplifier and said control circuit of the second differential amplifier each comprises:
   a phase shifter input with a voltage drop across said first inductor to generate an out of phase replica of the voltage drop; and
   a transconductance amplifier input with the out of phase replica of the voltage drop, that generates the replica of the first current.

16. A method of adjusting a resonance frequency of an L-C resonant circuit comprising a capacitor, a first inductor electrically coupled to the capacitor, and a second inductor magnetically coupled with the first inductor, the method comprising:
   forcing through the second inductor a second current that is a replica of a first current flowing through the first inductor; and
   establishing at least one of a scale factor and a phase of the second current as a function of the resonance frequency of the L-C resonant circuit.

17. The method of claim 16 wherein the second current is at least one of a scaled replica of the first current and an out of phase replica of the first current.

18. The method of claim 16 wherein the capacitor and the first inductor are electrically coupled in parallel.

19. The method of claim 16 wherein the capacitor and the first inductor are electrically coupled in series.

* * * * *